(12) United States Patent
Cheung et al.

(10) Patent No.: US 6,335,263 B1
(45) Date of Patent: Jan. 1, 2002

(54) METHOD OF FORMING A LOW TEMPERATURE METAL BOND FOR USE IN THE TRANSFER OF BULK AND THIN FILM MATERIALS

(75) Inventors: Nathan W. Cheung, Albany; Timothy David Sands, Moraga; William S. Wong, Berkeley, all of CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 09/535,658

(22) Filed: Mar. 22, 2000

(51) Int. Cl.[7] .......................... H01L 21/30; H01L 21/46
(52) U.S. Cl. ..................... 438/455; 438/458; 438/604
(58) Field of Search ................. 438/455, 458, 438/586, 584, 604

(56) References Cited

U.S. PATENT DOCUMENTS

| | | | |
|---|---|---|---|
| 5,837,561 A | * 11/1998 | Kish, Jr. et al. | 438/47 |
| 6,071,795 A | * 6/2000 | Cheung et al. | 438/458 |
| 6,176,925 B1 | * 1/2001 | Solomon et al. | 117/89 |
| 6,187,110 B1 | * 2/2001 | Henley et al. | 148/33.2 |

FOREIGN PATENT DOCUMENTS

WO   PCT/US01/09268   3/2001

* cited by examiner

*Primary Examiner*—Richard Elms
*Assistant Examiner*—Bradley Smith
(74) *Attorney, Agent, or Firm*—Pennie & Edmonds LLP

(57) ABSTRACT

A method of forming a low temperature metal bond includes the step of providing a donor substrate, such as a crystallographically oriented donor substrate, including a sapphire donor substrate or a MgO donors substrate. The donor substrate may also be quartz or fused silica. A thin film is grown on a surface of the donor substrate. The thin film may be an oxide, nitride or Perovskite. The invention may be implemented using nitride thin films, including AlN, GaN, InN, and all of their solid solutions, alloys, and multi-layers. An acceptor substrate is then produced. The acceptor substrate may be Si, GaAs, polymers, such as polyimide, or stainless steel for use in microrobotics. A multi-layer metal bond interface for positioning between the thin film and the acceptor substrate is then selected. The multi-layer metal bond interface must satisfy a set of criteria, such as low temperature bonding, low resistance to shear stress, capability to adhere to the donor and acceptor substrates, and the ability to form a thin new bonded layer. A bonded layer is then formed, at a temperature below approximately 200° C., between the thin film and the acceptor substrate using the multi-layer metal bond interface. The donor substrate is then severed from the thin film to isolate the thin film for subsequent processing.

31 Claims, 4 Drawing Sheets

METHOD OF FORMING A LOW TEMPERATURE METAL BOND FOR USE IN THE TRANSFER OF BULK AND THIN FILM MATERIALS

RELATED APPLICATIONS

This application is related to U.S. Ser. No. 09/012,829, filed Jan. 23, 1998, entitled "Separation of Thin Films from Transparent Substrates by Selective Optical Processing", which has common inventors and a common assignee. The related application is incorporated by reference herein.

BRIEF DESCRIPTION OF THE INVENTION

This invention relates generally to the handling of materials used in the electronics field. More particularly, this invention relates to a technique of forming a low temperature metal bond to facilitate the transfer of bulk and thin film materials used in the electronics field.

BACKGROUND OF THE INVENTION

The intimate integration of thin film materials with disparate properties is required to enhance the functionality of integrated Microsystems. For example, combining laser diodes with low cost electronics necessitates the integration of III–V semiconductors with silicon. The materials integration can be done simply by direct deposition of the thin film onto the final substrate. In many cases, however, direct deposition involves substantial sacrifices in the microstructural quality, properties and performance of the thin film. In some cases, such as integration of piezoelectric electro-ceramic thin films with polymer substrates, the processing conditions (e.g., temperature and ambient) preclude direct deposition. In these instances, a bonding and lift-off approach may be required.

A bonding process involves adhering a heterostructure (e.g., a thin film) still on its growth substrate to a final micro-machined, patterned, and metallized substrate. To allow maximum flexibility for a wide range of material combinations it would be highly desirable to adhere to a number of constraints. For example, the bonding layer should have low resistance to shear stress at temperatures below 200° C. such that submicron surface asperities and particulates do not prevent full surface contact. It would also be desirable to have a bonding layer that is both adherent to the heterostructure and the final acceptor substrate. In addition, the bonding process should be performed in such a manner that it does not leave behind a low melting point phase or residue. Ideally, the resulting bond would have low electrical resistance and low thermal resistance. Finally, the bonding layer should be thinner than the thin film to be transferred, such that its properties do not dominate those of the transferred thin film.

If the foregoing constraints could be satisfied, the opportunities for integration of thin film materials with other systems would increase. More particularly, opportunities for the direct integration of thin films with novel substrate materials for improved device performance would increase.

SUMMARY OF THE INVENTION

A method of forming a low temperature metal bond includes the step of providing a donor substrate, such as a crystallographically oriented donor substrate, including a sapphire donor substrate or a MgO donor substrate. The donor substrate may also be quartz or fused silica. A thin film is grown on a surface of the donor substrate. The thin film may be an oxide, nitride or Perovskite. The invention may be implemented using nitride thin films, including AlN, GaN, InN, and all of their solid solutions, alloys, and multi-layers. An acceptor substrate is then produced. The acceptor substrate may be Si, GaAs, polymers, such as polyimide, or stainless steel for use in microrobotics. A multi-layer metal bond interface for positioning between the thin film and the acceptor substrate is then selected. The multi-layer metal bond interface must satisfy a set of criteria, such as low temperature bonding, low resistance to shear stress, of durability to adhere to the donor and acceptor substrates, and the ability to form a thin new bonded layer. A bonded layer is then formed, at a temperature below approximately 200° C., between the thin film and the acceptor substrate using the multi-layer metal bond interface. The donor substrate is then severed from the thin film to isolate the thin film for subsequent processing.

An embodiment of the invention has utilized low temperature Pd—In metal bonding to bond GaN thin films onto Si, GaAs, and polyimide substrates. The Pd—In bonding layers form a $PdIn_3$ compound after pressure bonding at a temperature of approximately 200° C. Separation of the sapphire substrate from the GaN thin film can be achieved using a pulsed ultra-violet laser lift-off process. Thin film characterization by x-ray diffraction, scanning electron microscopy, and atomic force microscopy verify that the GaN retains its crystal quality before and after thin film separation and transfer. The technique of the invention creates opportunities for integration of GaN-based devices with other material systems. The "cut and paste" methodology of the invention may be used to combine GaN with other material systems that otherwise cannot be used in conventional growth processes. The technique of the invention allows direct integration of GaN with novel substrate materials for improved device performance.

BRIEF DESCRIPTION OF THE DRAWINGS

For a better understanding of the invention, reference should be made to the following detailed description taken in conjunction with the accompanying drawings, in which.

Like reference numerals refer to corresponding parts throughout the drawings.

DETAILED DESCRIPTION OF THE INVENTION

Figure 1:
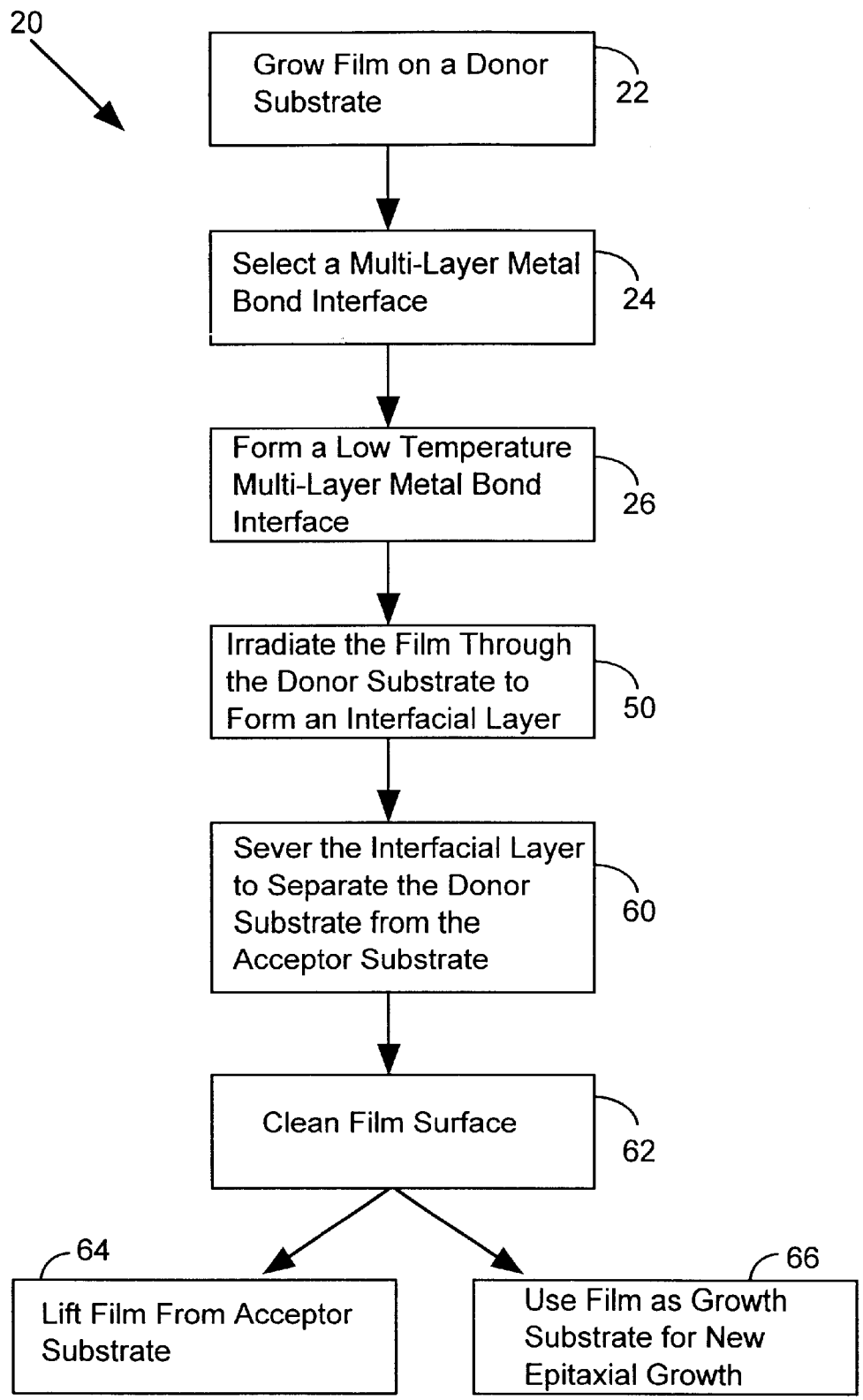
FIG. 1 illustrates processing steps performed in connection with the formation of a low temperature metal bond of the invention.

FIG. 1 illustrates a method 20 of forming a low temperature metal bond in accordance with an embodiment of the invention. The method 20 includes the step of growing film on a donor substrate (step 22). For example, a GaN semiconductor thin film may be grown on a crystallographically oriented growth substrate, such as sapphire or MgO.

The next processing step is to select a multi-layer metal bond interface that can be used to form a low temperature metal bond (step 24). As used herein, the term low temperature means approximately 200° C. or lower. The details associated with an embodiment of this step are described below in connection with FIG. 6.

Figure 2:
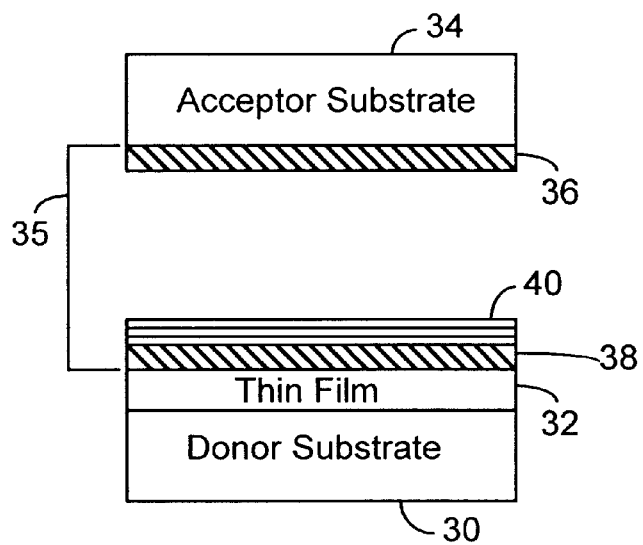
FIG. 2 is an exploded view of an acceptor substrate, a multi-layered metal bond interface, a thin film, and a donor substrate of the invention.

The next processing step is to form the selected multi-layer metal bond interface between the thin film and an acceptor substrate (step 26). FIG. 2 illustrates a donor substrate 30 with a thin film 32 grown thereon in accordance with step 22. FIG. 2 also illustrates an acceptor substrate 34. In one embodiment of the invention, the acceptor substrate 34 is Silicon. Positioned between the donor substrate 30 and the acceptor substrate 34 is a multi-layer metal bond interface 35. In the embodiment of FIG. 2, the multi-layer metal bond interface 35 includes an acceptor bonding under-layer 36, a donor bonding under-layer 38, and a bonding over-layer 40. In one embodiment of the invention, the acceptor bonding under-layer 36 includes a layer of approximately 100 nm of Pd. In one embodiment of the invention, the donor bonding under-layer 38 includes approximately 10 nm of Ti and approximately 100 nm of Pd. The Ti facilitates adhesion of Pd to a thin film, such as GaN. The bonding over-layer 40 may be formed with approximately 1000 nm of In. Preferably, the thickness of the Pd and In layers are chosen such that the ratio of Pd:In is maintained at 1:3 in order to form the compound $PdIn_3$ after completion of the bonding process. The ratio will also ensure total consumption of In so that no component of low-temperature phase will remain after bonding.

Figure 3:
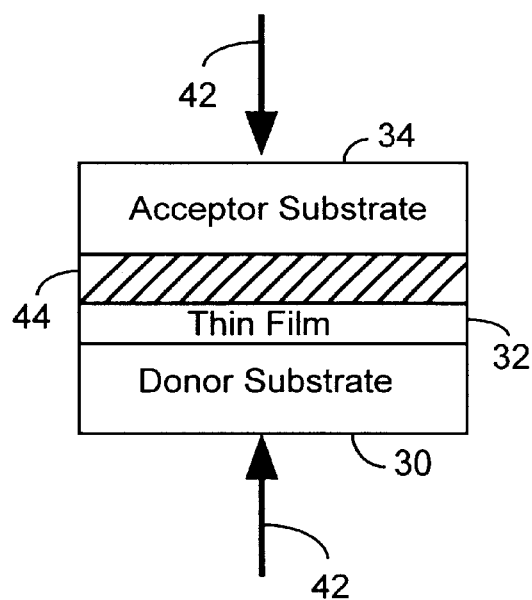
FIG. 3 illustrates an acceptor substrate, bonded layer, thin film, and donor substrate formed in accordance with an embodiment of the invention.

A low temperature (approximately 200° C. or lower) pressure bond, as represented by arrows 42 in FIG. 3, is then used to form a bonded layer 44 from the multi-layer metal bond interface 34. In one embodiment, the donor substrate 30 and acceptor substrate 34 are brought together under a moderate pressure of less than 10 MPa, preferably approximately 4 MPa within a nitrogen ambient. The temperature is then raised slightly above the melting point of the lowest melting temperature metal. In this example, In has the lowest melting temperature, with a melting temperature of approximately 156° C. Bonding is then performed at approximately 200° C. and the selected multi-layer metal bond interface 44 is formed between the thin film 32 and the acceptor substrate 34, as shown in FIG. 3.

In this example, the layer 44 is the compound $PdIn_3$. This layer 44 is a mechanically stable bond with a melting point of 664° C. The bonding time is selected to allow complete reaction of the metal multi-layers to form the desired new phase.

Figure 4:
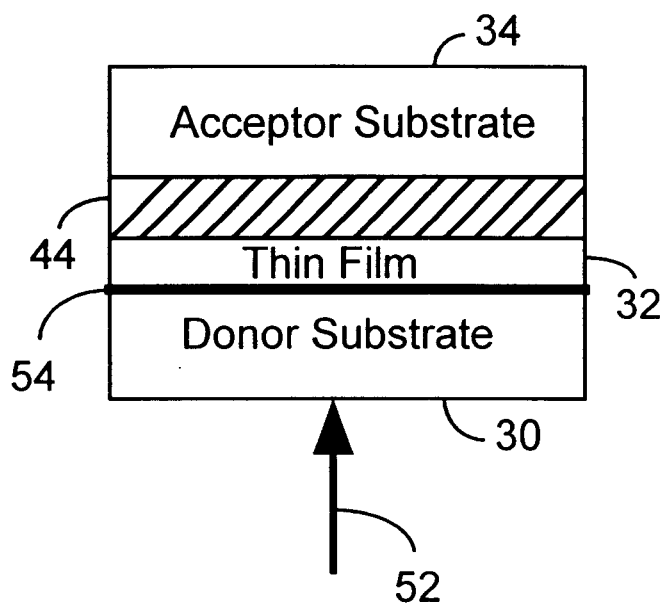
FIG. 4 illustrates the formation of an interfacial layer in accordance with an embodiment of the invention.

Returning to FIG. 2, the next processing step is to irradiate the thin film 32 through the donor substrate 30 to form an interfacial layer (step 50). Arrow 52 in FIG. 4 represents irradiated energy applied to the donor substrate 30. This operation is described in detail in the related application entitled "Separation of Thin Films from Transparent Substrates by Selective Optical Processing", U.S. Ser. No. 09/012,829, filed Jan. 23, 1998, which is incorporated by reference herein. In short, this step applies irradiated light of a wavelength that is substantially more strongly absorbed in the thin film 32 than in the donor substrate 30. This results in the formation of an interfacial layer between the thin film 32 and the donor substrate 30. FIG. 4 illustrates the resultant interfacial layer 54 produced between the thin film 32 and the donor substrate 30.

Figure 5:
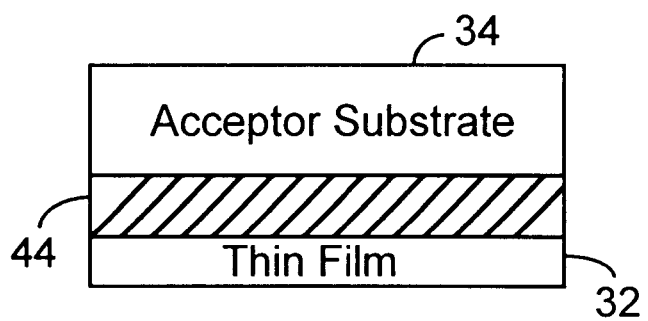
FIG. 5 illustrates a thin film isolated from its donor or substrate after processing in accordance with an embodiment of the invention.

The remaining steps illustrated in FIG. 1 are also described in the cited application, thus they are only discussed briefly herein. FIG. 1 illustrates that the next processing step is to sever the interfacial layer to separate the donor substrate 30 from the acceptor substrate 34 (step 60). The resultant structure is shown in FIG. 5. The thin film may then be cleaned (step 62). The cleaned film may then be lifted from the acceptor substrate (step 64) or it may be used as a growth substrate for new epitaxial growth (step 66).

In sum, most of the steps of FIG. 1 are consistent with the technology described in the previously cited application. The present invention departs from the previous technology in that a multi-layer metal bond interface is used to link the acceptor substrate 34 to the thin film 32. The formation of a low temperature metal bond in the disclosed manner is believed to be inventive. The donor substrate 30 removal process and subsequent processing described in connection with steps 50–66 of FIG. 1 may be used in accordance with the low temperature metal bond formation technique of the invention. However, other lift-off techniques may also be used in accordance with the low temperature metal bond formation technique of the invention.

Figure 6:
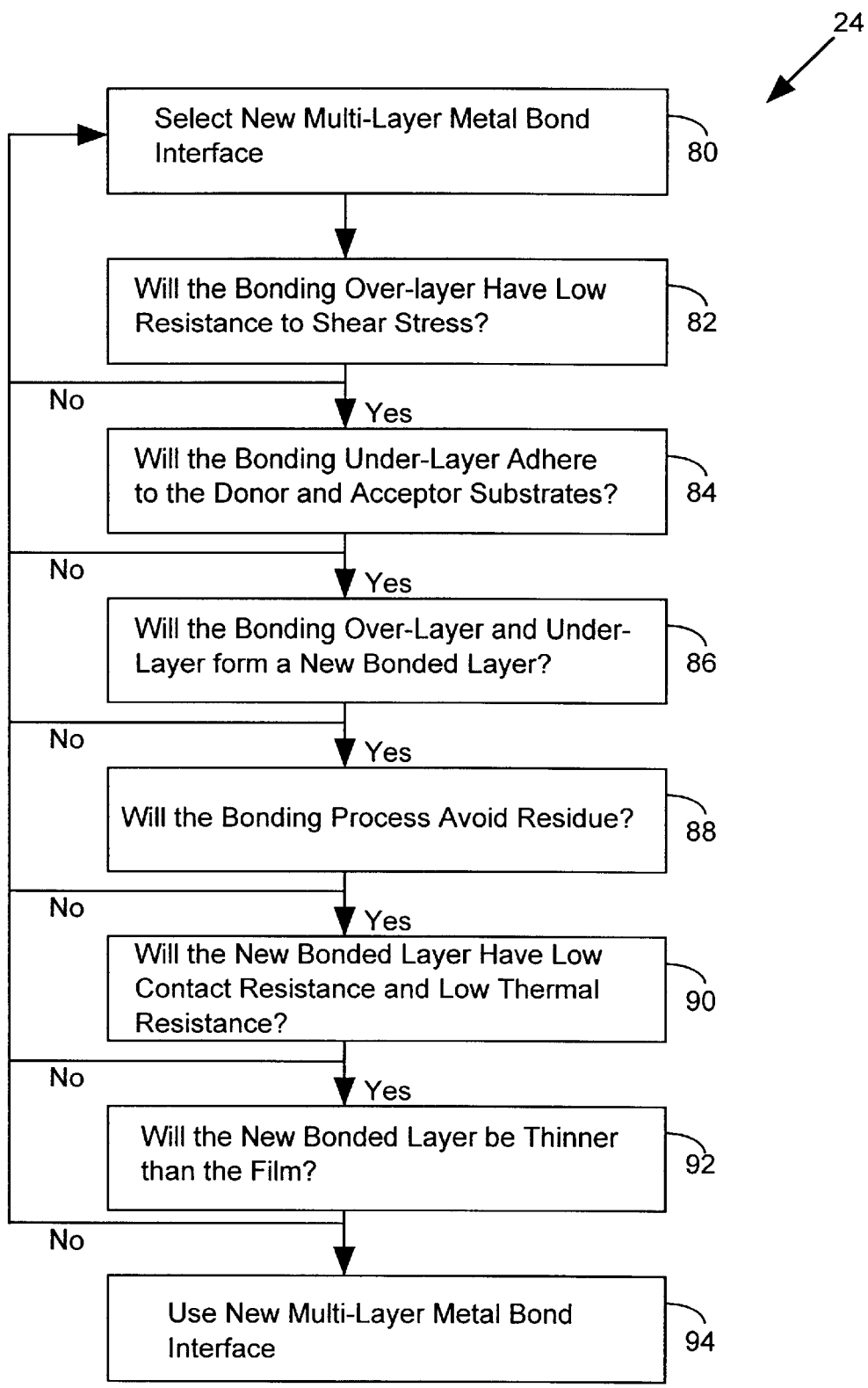
FIG. 6 illustrates processing steps associated with the selection of a multilayer metal bond interface for low temperature metal bonding in accordance with an embodiment of the invention.

FIG. 6 illustrates criteria that may be used to implement the step of selecting a multi-layer metal bond interface (step 24). The first step shown in FIG. 6 is to select a new multi-layer metal bond interface (step 80). It is then determined whether the bonding over-layer has a low resistance to shear stress at temperatures below 200° C., such that sub-micron surface asperities and particulates do not prevent full surface contact (step 82). As defined herein, a low resistance to shear stress means that the metal melts and flows to maximize contact area. This property makes the bond less susceptible to failure due to sub-micron and surface roughness, thus improving the yield of the bonding process.

If the selected multi-layer metal bond interface does not satisfy this criteria, a new multi-layer metal bond interface is selected at step 80. If the selected multi-layer metal bond interface does satisfy this criteria, it is determined whether the bonding under-layer will adhere to the donor and acceptor substrates (step 84). If not, a new multi-layer metal bond interface is selected at step 80; if so, it is determined whether the bonding over-layer and under-layer will form a new bonded layer (step 86). If a new layer will not be formed, then a different multi-layer metal bond interface is selected at step 80.

If a new layer will be formed, the condition at step 88 should be satisfied, namely, that the low temperature bonding process at or below approximately 200° C. will not produce a low melting point phase or residue. Elimination of the low melting point phase or residue by reaction with the other metallic constituents, after full contact is achieved permits subsequent processing at 200° C. or higher temperatures. If this condition is not satisfied, then a new multi-layer metal bond interface is selected at step 80. If this condition is satisfied, the condition of step 90 is considered. Step 90 determines whether the new bonded layer has low contact resistance. In the case of a wide gap semiconductor, such as GaN, low contact resistance means a specific contact resistance of no greater than $10^{-4}$ Ohm-$cm^2$. In the case of a conventional semiconductor, low contact resistance means a specific contact resistance of no greater than $10^{-6}$ Ohm-$cm^2$. In the case of a metal, low contact resistance means a specific contact resistance of no greater than $10^{-7}$ Ohm-$cm^2$.

Step 90 also determines whether the bonded layer has low thermal resistance. As used herein, low thermal resistance refers to a thermal conductivity of no lower than 10 Watts/m°K. If the conditions of step 90 are not satisfied, a new multi-layer metal bond interface is selected at step 80. If the conditions are satisfied, a final condition is tested at step 92, namely, whether the new bonded layer will be thinner than the film. This condition is tested so that the properties of the new bonded layer do not dominate those of the film. If this condition is satisfied, the selected multi-layer metal bond interface is used (step 94) in accordance with the processing shown in FIG. 1.

Although the invention has been fully described, the invention may be more fully appreciated in connection with a more specific example. The invention has been implemented with a GaN thin film 32 of approximately 3 $\mu$m on a double-sided polished sapphire donor substrate 30. A thin bilayer of Ti—Pd (5 nm and 100 nm thickness of Ti and Pd, respectively) was deposited onto the GaN by electron beam (e-beam) evaporation (base pressure of approximately $1 \times 10^{-7}$ Torr). The thin bilayer thereby forming the donor bonding under-layer 38. The acceptor substrate 34 was separately coated with a 100 nm thick e-beam evaporation Pd film, forming the acceptor bonding under-layer 35. An approximately 1000 nm In bonding over-layer 40 is then deposited on the donor bonding under-layer 38.

The Pd and In thicknesses were chosen such that the ratio of the Pd:In was maintained between 1:3 and 1:1 to insure complete consumption of the In during the low temperature bonding process. The GaN/sapphire structures were then bonded at a pressure of approximately 2.8 Mpa onto boron doped p-type Si (001), semi-insulating GaAs (001) or polymide substrates at 200° C. for 30 minutes in a flowing nitrogen ambient. In an embodiment of the invention, an inert metal layer (e.g., 1–10 nm of Ti) is placed as a diffusion barrier between Pd and In to delay the completion of the reaction at 200° C.

During the initial stage of the bonding, as the temperature exceeds the In melting point of approximately 156° C., molten In flows laterally to fill in any voids and encase submicron particulates and surface asperities, thus maximizing the contact area of the bond. The Pd+3In to $PdIn_3$ reaction begins at room temperature and is completed during the 200° C. treatment. The resulting $PdIn_3$ bond is strong enough to withstand the subsequent thermal and mechanical shock from the laser lift-off process (step 50 of FIG. 1).

All laser processing of the sapphire/GaN/Pd—In/receptor-substrate structures was performed in air using a Lamda Physik Lextra 200 KrF pulsed excimer laser (38 ns pulse width). The decomposition of the interfacial GaN into Ga metal and $N_2$ gas was accomplished with a single 600 mJ/$cm^2$ laser pulse directed through the transparent sapphire substrate. By melting the thin Ga rich interfacial layer ($T_m$=30° C.) after laser irradiation, lift-off, and transfer of the GaN film from sapphire onto the receptor substrate was completed. In using this two-step process, GaN films up to 20 $cm^2$ were successfully transferred by rastering a 0.03 $cm^2$ beam spot across the entire sample. A thin Ga rich layer on the surface of the exposed interface was easily removed with a 1:1 solution of HCl and de-ionized water. The transferred films were then characterized by x-ray diffraction, scanning electron microscopy, and atomic force microscopy to verify the structural integrity of the GaN film before and after lift-off and transfer.

Those skilled in the art will recognize a number of benefits associated with the invention. The primary impediment to implementing GaN technology is the lack of a lattice-matched substrate for GaN growth. This impediment necessitates heteroepitaxy on available but dissimilar substrates, such as sapphire and SiC. Furthermore, the incongruent decomposition of this compound at relatively low temperatures to produce metallic Ga and $N_2$ gas prevents the commercial feasibility of growing large bulk crystals and inhibits efforts to grow high quality thin films.

GaN based optoelectronic and electronic devices have been previously demonstrated on sapphire. However, device quality GaN material on substrates other than sapphire has not met with much success. The symmetry of the GaN crystal structure (hexagonal wurtzite structure), combined with the high GaN thin film growth temperatures prevent growth of high-quality material directly onto more common substrates, such as GaAs, InP or Si, thus impeding the direct integration of GaN with existing electronic and optoelectronic semiconductor technologies. Bulk GaN substrates are currently being investigated, but crystal size is limited to less than a few square centimeters.

GaN thin films grown on sapphire substrates exhibit pronounced roughness due in part to the large density of dislocations intersecting the film surface. Hence, direct bonding of the GaN/sapphire structures onto dissimilar substrates presents a formidable challenge. The use of a transient liquid phase to accommodate surface roughness by spreading laterally to fill voids has been shown to successfully join ceramic materials for high temperature applications. Of the low melting point metals, indium is a metal which liquefies above room temperature (above approximately 25° C.) for processing stability and below 200° C., thereby permitting bonding to a wide range of substrates including semiconductors, metals, glass, polymers and electro-ceramics. Melting the indium metal at 156° C. allows the metal to re-flow and fill in around surface asperities, thus accommodating rough surfaces. It is also known that palladium is adherent to most semiconductors and polymers, thus the Pd—In system is applied for low temperature bonding in which the compound $PdIn_3$ is the first phase to form at a Pd—In diffusion couple. Palladium is also optimal due to its resistance to oxidation. The resulting $PdIn_3$ phase also has a relatively high melting point of 664° C., thus, the Pd—In intermetallics are able to yield a stable high temperature $PdIn_3$ bond from a low temperature bonding process. Furthermore, the Pd—In system is an ideal bonding material due to its uniform native-oxide penetration, and limited and uniform semiconductor consumption, when in direct contact with a semiconductor.

The bonding process described, in conjunction with an optical lift-off process, allows for novel heterostructure stacking combinations of the GaN material system with other materials not possible by typical growth methods. GaN thin films can also be combined with other substrate materials more common in electronic and optoelectronic applications, such as Si or GaAs. The integration of GaN based materials with AlGaAs or AlInGaP on GaAs substrates allows for arrays of microscopic red, green and blue light emitting diodes on angle GaAs wafer for color display applications. GaN thin films can also be bonded to substrates of higher electrical and thermal conductivity than sapphire, thereby improving device performance by minimizing electrical series resistance and improving heat transfer from the active region.

The foregoing description, for purposes of explanation, used specific nomenclature to provide a thorough understanding of the invention. However, it will be apparent to one skilled in the art that the specific details are not required in order to practice the invention. In other instances, well known circuits and devices are shown in block diagram form in order to avoid unnecessary distraction from the underlying invention. Thus, the foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

What is claimed is:

1. A method of forming a low temperature metal bond, comprising the steps of:

providing a donor substrate;

growing a thin film on a surface of said donor substrate;

supplying an acceptor substrate;

selecting a multi-layer metal bond interface for positioning between said thin film and said acceptor substrate; and forming, at a temperature below approximately 200° C., a bonded layer between said thin film and said acceptor substrate from said multi-layer metal bond interface.

2. The method of claim 1 wherein said providing step includes the step of providing a crystallographically oriented donor substrate.

3. The method of claim 2 wherein said providing step includes the step of providing a sapphire donor substrate.

4. The method of claim 2 wherein said providing step includes the step of providing a MgO donor substrate.

5. The method of claim 2 wherein said providing step includes the step of providing a quartz donor substrate.

6. The method of claim 1 wherein said providing step includes the step of providing a fused silica donor substrate.

7. The method of claim 1 wherein said growing step includes the step of growing a GaN thin film on said donor substrate.

8. The method of claim 1 wherein said supplying step includes the step of supplying a Si acceptor substrate.

9. The method of claim 1 wherein said supplying step includes the step of supplying a GaAs acceptor substrate.

10. The method of claim 1 wherein said supplying step includes the step of supplying a polymer substrate.

11. The method of claim 10 wherein said supplying step includes the step of supplying a polyimide substrate.

12. The method of claim 1 wherein said selecting step includes the step of selecting a multi-layer metal bond interface with a bonding over-layer with low resistance to shear stress.

13. The method of claim 1 wherein said selecting step includes the step of selecting a multi-layer metal bond interface with a bonding under-layer that adheres to said donor substrate and said acceptor substrate.

14. The method of claim 1 wherein said selecting step includes the step of selecting a multi-layer metal bond interface with a bonding over-layer and bonding under-layer that will from a new bonded layer.

15. The method of claim 1 wherein said selecting step includes the step of selecting a multi-layer metal bond interface that produces a bonded layer with low contact resistance and low thermal resistance.

16. The method of claim 1 wherein said selecting step includes the step of selecting a multi-layer metal bond interface that produces a bonded layer that is thinner than said thin film.

17. The method of claim 1 wherein said selecting step includes the step of selecting a Pd—In multi-layer metal bond interface.

18. The method of claim 1 wherein said selecting step include the step of selecting a donor bonding under-layer comprising Ti and Pd, selecting an acceptor bonding under-layer comprising Pd, and selecting a bonding over-layer comprising In.

19. The method of claim 1 further comprising the step of irradiating said thin film through said donor substrate to form an interfacial layer.

20. The method of claim 18 further comprising the step of severing said interfacial layer to separate said donor substrate from said acceptor substrate.

21. The method of claim 20 further comprising the step of detaching said thin film from said acceptor substrate.

22. The method of claim 20 further comprising the step of growing a new epitaxial growth on said thin film.

23. A method of bonding a film disposed on a first substrate to a second substrate, comprising:

disposing a first bonding layer on said film, said first bonding layer comprising a first material having a first melting point;

forming a second bonding layer on said second substrate, said second bonding layer comprising a second material having a second melting point; and annealing, at a temperature above a lower one of said first melting point and said second melting point, said first bonding layer and said second bonding layer to form a bonded layer between said film and said second substrate, wherein said bonded layer has a third melting point that is above said lower one of said first melting point and said second melting point.

24. The method of claim 23, wherein the second bonding layer comprises the first material.

25. The method of claim 23, wherein said disposing comprises depositing a bilayer of Ti—Pd onto said film.

26. The method of claim 25, wherein said depositing comprises depositing an approximately 5 nm thick layer of Ti and a 100 nm layer of Pd.

27. The method of claim 23, wherein said forming comprises depositing a layer of Pd and a layer of In onto said second substrate.

28. The method of claim 23, wherein said forming comprises depositing an approximately 100 nm thick layer of Pd onto said second substrate by electron beam evaporation.

29. The method of claim 28, wherein said forming comprises depositing an approximately 1000 nm thick layer of In onto said layer of Pd.

30. The method of claim 23, wherein said annealing comprises coupling said first bonding layer to said second bonding layer at a pressure of approximately 2.8 Mpa.

31. The method of claim 23, wherein said annealing comprises coupling said first bonding layer and said second bonding layer at a temperature below approximately 200° C.

* * * * *